(12) United States Patent
Freund et al.

(10) Patent No.: US 6,272,163 B1
(45) Date of Patent: Aug. 7, 2001

(54) METHOD FOR FABRICATING HIGH SPEED FABRY-PEROT LASERS FOR DATA COMMUNICATION

(75) Inventors: Joseph Michael Freund, Fogelsville; George John Przybylek, Douglasville; Dennis Mark Romero, Allentown, all of PA (US); Robert Ewing Behringer, Monmouth Beach, NJ (US)

(73) Assignee: Agere Systems Inc., Orlando, FL (US)

( * ) Notice: Subject to any disclaimer, the term of this patent is extended or adjusted under 35 U.S.C. 154(b) by 0 days.

(21) Appl. No.: 09/256,574

(22) Filed: Feb. 24, 1999

(51) Int. Cl.$^7$ ............................. H01S 3/10; H01S 5/00; H01S 3/20
(52) U.S. Cl. .................. 372/49; 372/9; 372/26; 372/28; 372/43; 372/45; 372/54
(58) Field of Search ................... 372/9, 26, 28, 372/43, 45, 49, 54

(56) References Cited

U.S. PATENT DOCUMENTS 4,809,290 * 2/1989 White et al. ........................... 372/44
5,179,567 * 1/1993 Uomi et al. ............................ 372/46

OTHER PUBLICATIONS

Buus et al., A theoretical and Experimental Investigation of Fabry–Perot Semiconductor Laser Amplifiers, Jun. 1985, vol. 21 No. 6, pp. 614–618.*

* cited by examiner

Primary Examiner—Frank G. Font
Assistant Examiner—Armando Rodriguez

(57) ABSTRACT

A method for fabricating a Fabry-Perot laser having a cavity length and facet reflectivity product tuned to cause the laser to exhibit a relaxation oscillation frequency of at least 10 GHz, wherein the laser is capable of being modulated at 10 Gb/sec at drive currents between about 20 and 40 mA.

24 Claims, 3 Drawing Sheets

US 6,272,163 B1

METHOD FOR FABRICATING HIGH SPEED FABRY-PEROT LASERS FOR DATA COMMUNICATION

FIELD OF THE INVENTION

This invention relates to fiber optic data networks, and more particularly to a method for fabricating a high speed (10 Gb/sec) Fabry-Perot laser used in an optical data network.

BACKGROUND OF THE INVENTION

Optical data networks are widely used today in data communications systems. The high carrier frequency of light, i.e., $10^{14}$ Hz, enables it to be modulated at high frequencies such that a single optical communication channel can transmit significantly greater amounts of data then other widely used media such as copper wire or coaxial cable.

Conventional high speed optical networks are relatively expensive due to the high cost of the optical components used in such networks. Significant reductions in the cost of such networks can be realized by using low cost, high performance components capable of being modulated at 10 Gb/sec and having low drive currents. Fabry-Perot lasers are an attractive choice for such systems because they have large output powers and are relatively inexpensive. However, conventional Fabry-Perot lasers suffer from a significant drawback. Specifically, they can not be modulated effectively at 10 Gb/sec, particularly at low drive current biases of about 20 to 40 mA.

SUMMARY OF THE INVENTION

A method for fabricating a Fabry-Perot laser having a cavity length and facet reflectivity product which are tuned to cause the laser to exhibit a relaxation oscillation frequency of at least 10 GHz. Such lasers are capable of being modulated at 10 Gb/sec at drive currents between about 20 and 40 mA.

In a first embodiment of the present invention, the method comprises providing a laser having a cleaved cavity and selecting a facet reflectivity product for the laser which will cause the laser to have a relaxation oscillation frequency of at least 10 GHz when a predetermined current bias is applied to the laser. Reflective coatings are then applied to the facets. The coatings have reflectivities which are selected to produce a reflectivity product that is substantially equal to the selected facet reflectivity product.

In a second embodiment of the present invention, the method comprises providing a laser having a cavity and selecting both a cavity length and a facet reflectivity product for the laser cavity which will cause the laser to have a relaxation oscillation frequency of at least 10 GHz when a predetermined current bias is applied to the laser. The laser cavity is cleaved into a bar having opposing facets which define a Fabry-Perot cavity length substantially equal to the selected cavity length. Reflective coatings are applied to the facets. The coatings have reflectivities which are selected to produce a reflectivity product that is substantially equal to the selected facet reflectivity product.

In a third embodiment of the present invention, the method comprises providing a laser having a cavity and selecting a cavity length for the laser which will cause the laser to have a relaxation oscillation frequency of at least 10 GHz when a predetermined current bias is applied to the laser. The laser cavity is then cleaved into a bar having opposing facets which define a Fabry-Perot cavity length substantially equal to the selected cavity length. The facets remain uncoated.

DETAILED DESCRIPTION OF THE INVENTION

Figure 1:
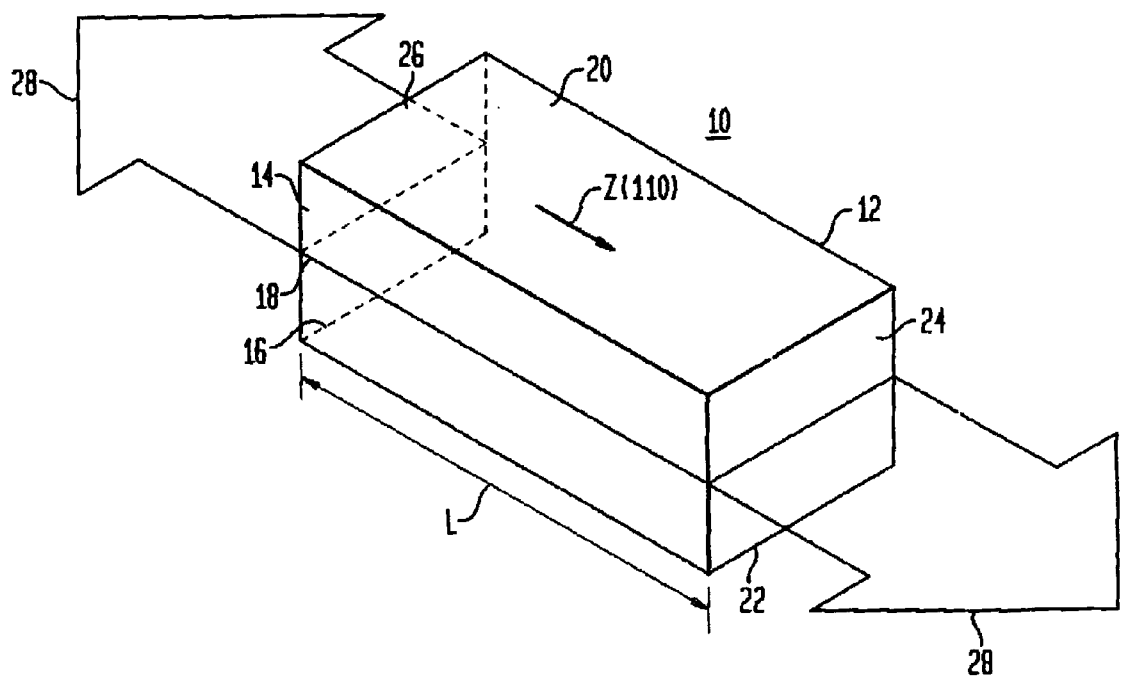
FIG. 1 shows a perspective view of an exemplary high speed (10 Gb/sec) Fabry-Perot semiconductor laser fabricated according to the method of the present invention.

The present invention discloses a method for fabricating a Fabry-Perot laser having a cavity length and facet reflectivity product which are tuned to cause the laser to exhibit a relaxation oscillation frequency of at least 10 GHz. FIG. 1 shows an exemplary high speed (10 Gb/sec) Fabry-Perot semiconductor diode laser 10 fabricated according to the present invention. Laser 10 comprises a laser bar 12 composed of a semiconductor material such as InP or GaAs. Laser bar 12 includes a P-type conductivity portion 14, an N-type conductivity portion 16 and a PN junction 18 formed therebetween. The major face of the P-type conductivity portion 14 includes a first metal contact 20 and the major face of the N-type conductivity portion 16 includes a second metal contact 22. Laser bar 12 includes a pair of parallel planes or facets 24, 26 which are cleaved or polished perpendicular to the <110> axis. A Fabry-Perot laser cavity structure having a cavity length L is defined between facets 24, 26. When a biasing current is applied to the laser via metal contacts 20, 22, laser light 28 is emitted from facets 24, 26.

Figure 2:
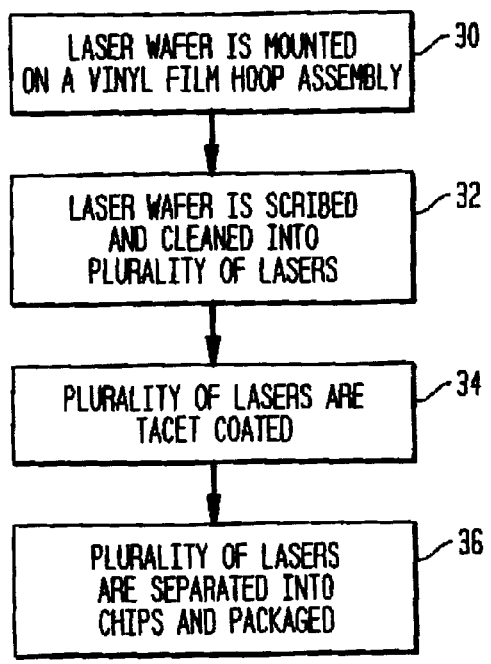
FIG. 2 shows a flowchart of an exemplary embodiment of the method for fabricating the laser shown in FIG. 1.

FIG. 2 shows a flowchart depicting the steps of the inventive method used to fabricate laser 10 shown in FIG. 1. At step 30, a laser wafer section is mounted on a vinyl film hoop assembly. The laser wafer section is composed of an appropriate semiconductor material such as InP or GaAs, and has P and N-type conductivity portions and first and second metal contact layers.

At step 32, the laser wafer section is scribed and cleaved into a plurality of lasers. At step 34, the plurality of lasers are facet coated. The cavity lengths and facet reflectivity products of the plurality of lasers are predetermined in accordance with the present invention so that they achieve a relaxation oscillation frequency (ROF) of at least 10 GHz at a desired drive current as will be explained below. At step 36, the plurality of lasers are separated into chips and packaged.

The cavity length and facet reflectivity product of laser 10 are predetermined so that laser 10 achieves an ROF of at least 10 GHz, wherein the ROF is a bandwidth measurement of the interaction between the laser cavity and the optical energy stored in the laser cavity. This interaction is responsible for direct modulation in semiconductor lasers. Fabry-Perot lasers, such as laser 10 shown in FIG. 1, which are tuned to achieve ROFs at least 10 GHz can be easily modulated at speeds of 10 Gb/sec. The ROF can be written as:

$$f_r = \frac{1}{2\pi}\sqrt{\frac{Ap_0}{\tau_0}} \quad (1)$$

where $p_o$ is the steady state photon density, A is the differential optical gain, and $$\tau_p = \frac{1}{v}\left(\alpha + \frac{1}{L}\ln\frac{1}{R_1 R_2}\right)$$

is the photon lifetime, where v is the group velocity of the light, a is the distributed loss, L is the length of the laser cavity, and R is the mirror reflectivity. In order to maximize $f_r$ by tuning externally adjustable quantities, $I_{bias}$ R and L, equation (1) is rewritten as:

$$f_r = \frac{1}{2\pi}\sqrt{B\frac{1}{L}\left[I - \frac{wL}{\eta}J_o\exp\left[\frac{1}{\Gamma G_o}\left(\alpha - \frac{1}{2L}\ln\left(\frac{1}{R_1 R_2}\right)\right) - 1\right]\right]} \quad (2)$$

where w is the width of the laser cavity, h is the quantum efficiency, $J_o$ is the saturation current density, G is the optical confinement factor, a is the distributed loss, $G_o$ is the saturation gain, L is the length of the laser cavity, I is the bias current, and $R_1$ and $R_2$ are the reflectivities of the facets. B is a laser specific constant which can be written as:

$$B = \frac{\Gamma}{dw}\frac{v\eta}{q}A \quad (3)$$

where d is the thickness of the laser cavity and q is the charge of an electron.

Figure 3A:
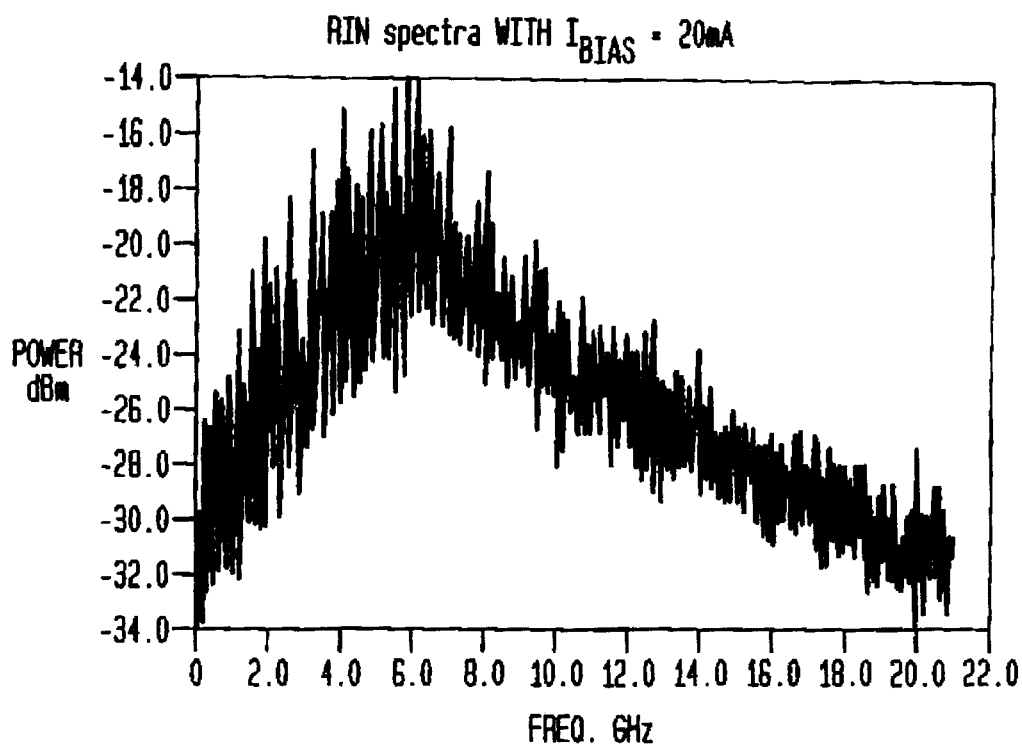
FIGS. 3A and 3B show RIN spectra measured between 0 and 22 GHz for a conventionally fabricated Fabry-Perot laser biased at two different threshold currents.
Figure 3B:
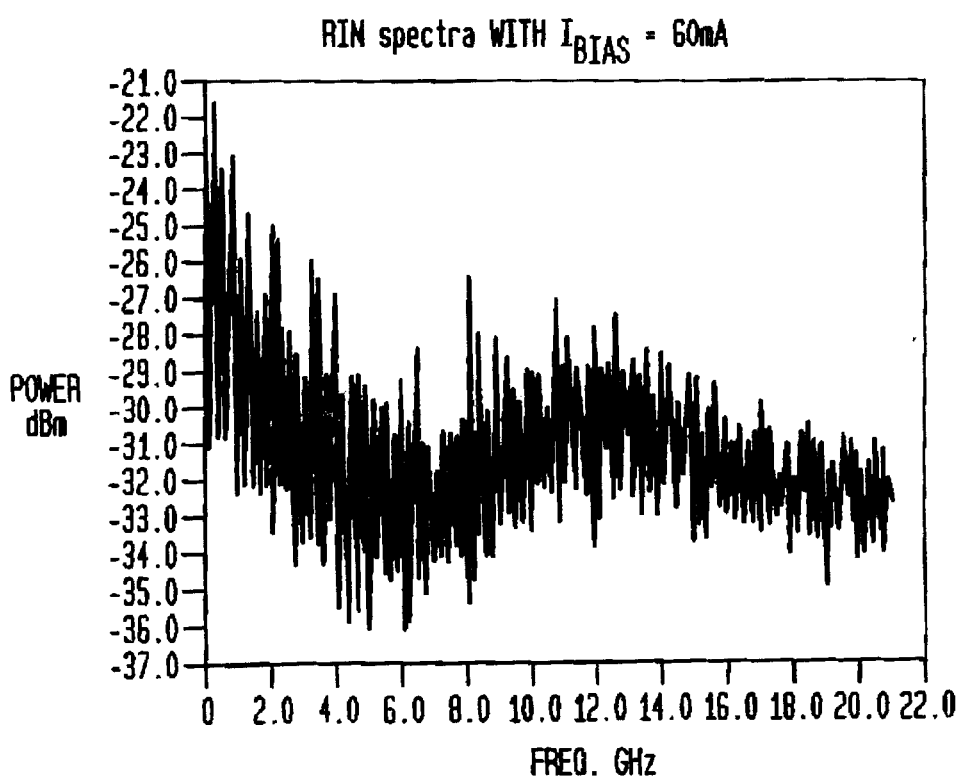

To tune laser 10 fabricated according to the method of the present invention, it is necessary to first measure the relative intensity noise (RIN) spectrum of conventionally fabricated Fabry-Perot lasers having different facet reflectivities biased at different threshold currents. FIGS. 3A and 3B show a typical series of RIN spectra measured between 0 and 22 GHz for a conventionally fabricated Fabry-Perot laser biased at two different threshold currents. These RIN measurements were taken using a facet reflectivity product of 0.15/0.70. FIG. 3A shows RIN spectra of this laser biased at a threshold current $I_{bias}$=20 mA, and FIG. 3B shows RIN spectra of this laser biased at a threshold current $I_{bias}$=60 mA. The frequency at which the RIN peaks is used as $f_r$ in equation (2) for calculating cavity lengths and facet reflectivity products which will maintain $f_r$ at each of the different threshold currents.

Figure 4:
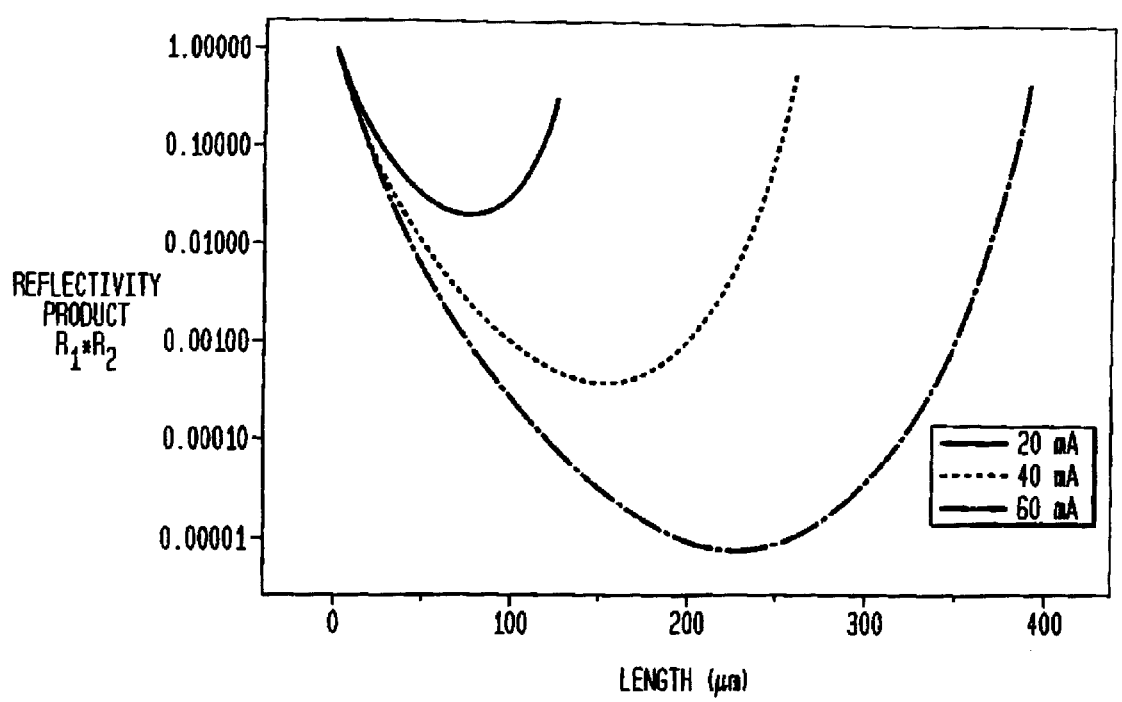
FIG. 4 shows plots of facet reflectivity products ($R_1R_2$) versus laser cavity length ($\mu$m) calculated using RIN spectra data similar to that shown in FIGS. 3A and 3B to obtain the relaxation oscillation frequency for the laser shown in FIG. 1.

FIG. 4 shows a plot of facet reflectivity products $(R_1 R_2)$ versus cavity length ($\mu$m) calculated using equation (2), and RIN spectra data having the following values: $\eta$=0.8, a=10 cm$^{-1}$, $G_o$=1450 cm$^{-1}$, $J_o$=2800 A/cm$^2$, w=1 $\mu$m, G=0.084, and d=250 nm. Specifically, FIG. 4 shows the corresponding cavity lengths ($\mu$m) and facet reflectivity products $(R_1 R_2)$ required to achieve an ROF equal to 10 GHz for different threshold currents $J_{bias}$. Fabry-Perot lasers having facet reflectivity products and cavity lengths adjusted in accordance with any point above the contour for a given threshold current $I_{bias}$ will have an ROF of at least 10 GHz.

As shown in FIG. 4, conventional Fabry-Perot lasers having a cavity length of 250 $\mu$m and a standard facet reflectivity product of 0.30/0.30 can not attain an ROF of 10 GHz when driven at a bias current of about 40 mA.

However, if the standard facet reflectivity product of such a laser is increased from 0.30/0.30 to, for example, 0.70/0.70, then as shown in FIG. 4, no other design changes need to be made to fabricate a high speed laser able to attain an ROF of at least 10 GHz when driven at a bias current of about 40 mA. If the cavity length of such a laser is also reduced to about 125 $\mu$m, an ROF of at least 10 GHz can be attained when driven at a bias current of about 20 mA.

Lasers having symmetrical facet reflectivities produce less power than lasers having asymmetrical facet reflectivities. Therefore, if desired or necessary, asymmetrical facet reflectivities can be used to increase the power of laser 10. Although the output power of laser 10 decreases with an increasing facet reflectivity product, trading output power for an increased ROF is acceptable in data communication applications because the transmission lengths over which the data is transmitted are relatively short and therefore do not require high power. Accordingly, the facet reflectivity product can be significantly increased without reducing the output power below about 2 dBm which is considered the minimum required output power for data communication applications.

It should be understood that the embodiments described herein are merely exemplary and that a person skilled in the art may make many variations and modifications to the embodiments utilizing functionally equivalent elements to those described herein. Any and all such variations or modifications as well as others which may become apparent to those skilled in the art, are intended to be included within the scope of the invention as defined by the appended claims.

What is claimed is:

1. A method for fabricating a laser having a Fabry-Perot laser cavity structure, comprising the steps of:

providing a laser having a cleaved cavity;

selecting a facet reflectivity product for the laser which will cause the laser to have a relaxation oscillation frequency of at least 10 GHz when a predetermined current bias is applied to the laser, wherein selecting a facet reflectivity product includes measuring the relative intensity noise (RIN) spectrum of at least one conventionally fabricated Fabry-Perot laser having different facet reflectivities when driven at a plurality of current biases different from the predetermined current bias, and using data obtained from RIN spectrum measurements in the equation $$f_r = \frac{1}{2\pi}\sqrt{B\frac{1}{L}\left[I - \frac{wL}{\eta}J\cdot\exp\left[\frac{1}{\Gamma G_o}\left(\alpha - \frac{1}{2L}\ln\left(\frac{1}{R_1 R_2}\right)\right) - 1\right]\right]}$$

wherein $f_r$ is the relaxation oscillation frequency of the laser, w is the width of the laser cavity, h is the quantum efficiency, $J_o$ is the saturation current density, G is the optical confinement factor, a is the distributed loss, $G_o$ is the saturation gain, L is the length of the laser cavity, I is the bias current, and $R_1$ and $R_2$ are the reflectivities of the facets, and wherein B is a laser specific constant which can be written as $$B = \frac{\Gamma}{dw}\frac{v\eta}{q}A$$

wherein d is the thickness of the laser cavity and q is the charge of an electron, for determining a facet reflectivity product which will maintain $f_r$ at each one of the plurality of current biases; and applying reflective coatings to the facets, wherein the coatings have reflectivities selected to produce a reflectivity product that is substantially equal to the selected facet reflectivity product.

2. The method according to claim 1, wherein the predetermined current bias is about 40 mA.

3. The method according to claim 1, wherein the RIN spectrum of the at least one conventionally fabricated Fabry-Perot laser is measured between about 0 and 22 GHz.

4. The method according to claim 3, wherein the data is a frequency at which the RIN spectrum peaks.

5. The method according to claim 4, wherein the frequency at which the RIN spectrum peaks is the relaxation oscillation frequency of the laser.

6. The method according to claim 1, wherein the laser is composed of a semiconductor material.

7. The method according to claim 1, wherein the laser can be modulated at about 10 Gb/sec.

8. A method for fabricating a laser having a Fabry-Perot laser cavity structure, comprising the steps of:

providing a laser having a cavity;

selecting a laser cavity length and a facet reflectivity product for the laser cavity which will cause the laser cavity to leave a relaxation oscillation frequency of at least 10 GHz wherein a predetermined current bias is applied to the laser, wherein the selecting step includes measuring the relative intensity noise (RIN) spectrum of at least one conventionally fabricated Fabry-Perot laser having different facet reflectivities when drive in at a plurality of current biases different from the predetermined current bias, and using data obtained from the RIN spectrum measurements in the equation $$f_r = \frac{1}{2\pi}\sqrt{B\frac{1}{L}\left[I - \frac{wL}{\eta}J\cdot\exp\left[\frac{1}{\Gamma G_o}\left(\alpha - \frac{1}{2L}\ln\left(\frac{1}{R_1 R_2}\right)\right) - 1\right]\right]}$$

wherein $f_r$ is the relaxation oscillation frequency of the laser cavity, w is the width of the cavity of the laser cavity, h is the quantum efficiency, $J_o$ is the saturation current density, G is the optical confinement factor, a is the distributed loss, $G_o$ is the saturation gain, L is the length of the laser cavity, I is the bias current, and $R_1$ and $R_2$ are the reflectivities of the facets, and wherein B is a laser specific constant which can be written as $$B = \frac{\Gamma}{dw}\frac{v\eta}{q}A$$

wherein d is the thickness of the laser cavity and q is the charge of an electron, for determining a facet reflectivity product which will maintain $f_r$ at each one of the plurality of current biases;

cleaving the laser cavity into a bar having opposing facets which define a Fabry-Perot cavity length substantially equal to the selected cavity length;

applying reflective coatings to the facets, the coatings having reflectivities selected to produce a reflectivity product that is substantially equal to the selected facet reflectivity product.

9. The method according to claim 8, wherein the predetermined current bias is about 20 mA.

10. The method according to claim 8, wherein the RIN spectrum of the at least one conventionally fabricated Fabry-Perot laser is measured between about 0 and 22 GHz.

11. The method according to claim 10, wherein the data is a frequency at which the RIN spectrum peaks.

12. The method according to claim 11, wherein the frequency at which the RIN spectrum peaks is the relaxation oscillation frequency of the laser cavity.

13. The method according to claim 8, wherein the laser cavity is composed of a semiconductor material.

14. The method according to claim 8, wherein the laser can be modulated at about 10 Gb/sec.

15. A method for fabricating a laser having a Fabry-Perot laser cavity structure, the method comprising the steps of:

providing a laser having a cavity; selecting a cavity length for the laser which will cause the laser to have a relaxation oscillation frequency of at least 10 GHz when a predetermined current bias is applied to the laser, wherein the selecting step includes measuring the relative intensity noise (RIN) spectrum of at least one conventionally fabricated Fabry-Perot laser having different facet reflectivities when driven at a plurality of different current biases, and using data obtained from the RIN spectrum measurements in the equation $$f_r = \frac{1}{2\pi}\sqrt{B\frac{1}{L}\left[I - \frac{wL}{\eta}J\cdot\exp\left[\frac{1}{\Gamma G_o}\left(\alpha - \frac{1}{2L}\ln\left(\frac{1}{R_1 R_2}\right)\right) - 1\right]\right]}$$

wherein $f_r$ is the relaxation oscillation frequency of the laser, w is the width of the laser cavity, h is the quantum efficiency, $J_o$ is the saturation current density, G is the optical confinement factor, a is the distributed loss, $G_o$ is the saturation gain, written as $$B = \frac{\Gamma}{dw}\frac{v\eta}{q}A$$

wherein d is the thickness of the laser cavity and q is the charge of an electron, for determining a facet reflectivity product which will maintain $f_r$ at each of the plurality of different current biases; and cleaving the laser into a bar having opposing facets which define a Fabry-Perot cavity length substantially equal to the selected cavity length, wherein the facets are uncoated.

16. The method according to claim 15, wherein the predetermined current bias is about 40 mA.

17. The method according to claim 15, wherein the RIN spectrum of the at least one conventionally fabricated Fabry-Perot laser is measured between about 0 and 22 GHz.

18. The method according to claim 17, wherein the data is a frequency at which the RIN spectrum peaks.

19. The method according to claim 18, wherein the frequency at which the RIN spectrum peaks is the relaxation oscillation frequency of the laser.

20. The method according to claim 15, wherein the laser is composed of a semiconductor material.

21. The method according to claim 15, wherein the laser can be modulated at about 10 Gb/sec.

22. A laser comprising a laser bar having opposing facets which define a Fabry-Perot laser cavity structure therebetween, the cavity structure having a length and the facets having a facet reflectivity product which provides the laser with a relaxation oscillation frequency of at least 10 GHz when a predetermined current bias is applied thereto, the facet reflectivity product being selected by measuring the relative intensity noise (RIN) spectrum of at least one conventionally fabricated Fabry-Perot laser having different facet reflectivities when driven at a plurality of current biases different from the predetermined current bias, and using data obtained from RIN spectrum measurements in the equation $$f_r = \frac{1}{2\pi}\sqrt{B\frac{1}{L}\left[I - \frac{wL}{\eta}J\cdot\exp\left[\frac{1}{\Gamma G_o}\left(\alpha - \frac{1}{2L}\ln\left(\frac{1}{R_1R_2}\right)\right) - 1\right]\right]}$$

wherein $f_r$ is the relaxation oscillation frequency of the laser, w is the width of the laser cavity, h is the quantum efficiency, $J_o$ is the saturation current density, G is the optical confinement factor, a is the distributed loss, $G_o$ is the saturation gain, L is the length of the laser cavity, I is the bias current, and $R_1$ and $R_2$ are the reflectivities of the facets, and wherein B is a laser specific constant which can be written as $$B = \frac{\Gamma}{dw}\frac{v\eta}{q}A,$$

wherein d is the thickness of the laser cavity and q is the charge of an electron, for determining a facet reflectivity product which will maintain $f_r$ at each one of the plurality of current biases.

23. The laser according to claim 22, wherein the cavity length ranges from about 25to150 μm.

24. The laser according to claim 22, wherein the facet reflectivity product is at least 0.1.

* * * * *